United States Patent
Regelman et al.

(10) Patent No.: US 6,574,626 B1
(45) Date of Patent: Jun. 3, 2003

(54) METHOD AND APPARATUS FOR ADMINISTRATION OF EXTENDED MEMORY

(75) Inventors: Yury Regelman, Millbraw, CA (US); Robert Mayrus Tromp, Loveland, CO (US); Alan S Krech, Jr., Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 307 days.

(21) Appl. No.: 09/675,679

(22) Filed: Sep. 29, 2000

(51) Int. Cl.[7] .................. G06F 17/30; G06F 12/00; G06F 12/14
(52) U.S. Cl. ................. 707/6; 711/2; 711/104
(58) Field of Search ............. 707/1, 6–7, 203, 707/54; 711/1–3, 6, 100–104, 200, 220

(56) References Cited

U.S. PATENT DOCUMENTS 5,784,553 A * 7/1998 Kolawa et al. ............... 714/38

6,370,681 B1 * 4/2002 Dellarocas et al. ......... 717/110

* cited by examiner

Primary Examiner—Alford Kindred

(57) ABSTRACT

A method for managing execution of program includes a memory management process to optimize use of primary and secondary memories 20,21, by storing all software units in the secondary memory 21 and copying specific software units necessary for execution of the program to the primary memory 20. Because the memory management process is performed during run-time, a process of calculating address values for the step of copying and offset values for the step of pattern dependency resolution are implemented in hardware. A development and debug application of the disclosed method is used to access specific memory locations without requiring a recompile and download of the code, while the data manipulator is used to perform efficient memory de-fragmentation.

22 Claims, 11 Drawing Sheets

```
typedef struct apgFileDescriptor {  ~402
    char name[MAX_SYMBOL_LENGTH +1];
    int numpingroups;
    int numpatterns;
    int numsubroutines;
    int numlogicpatterns;
    int numecamsettings;
    int numacamsettings;
    int numtimingsets;
    PinInfo
    GroupInfo              **pingroups;
    ApgPatternDescriptor   **patterns;  ~404
    ApgPatternDescriptor   **subroutines; ~406
    ApgPatternDescriptor   **logicpatterns;
    CamSetting             **acamsettings;    408
    CamSetting             **ecamsettings;
    TimeSet                *periodTable;

```
typedef struct apgPatternDescriptor {  ~502
    char        name[MAX_SYMBOL_LENGTH + 1];
    char        filename[MAX_SYMBOL_LENGTH + 1];
    int         loadOffsetExt;
    int         formatLoadOffsetExt;
    int         loadOffsetInt;  ~504
    int         formatLoadOffsetInt;
    int         vectorCount;  ~506
    int         siteCount;
    int         eliCount;
    int         flags;
    int         numunresolvedsymbols;
    int         numentrypoints;
    int         *siteformats PatternType           patternType;
    EntryPoint            **entryPoints;              508
    UnresolvedSymbol      **unresolvedSymbols;
    ApgFileDescriptor     *filedescriptor;
    BranchConditionTable  *branchConditionTable
} ApgPatternDescriptor;

typedef struct unresolvedSymbol {  ~512
    char name[MAX_SYMBOL_LENGTH + 1];
    /*offset value is relative to beginning of pattern*/
    unsigned int offset;  ~510
    SymbolUsage usage;  ~514
} UnresolvedSymbol;
```

*FIG. 5*

METHOD AND APPARATUS FOR ADMINISTRATION OF EXTENDED MEMORY

BACKGROUND

Electronics devices and capabilities have grown common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify; a need for repair, a location of the repair, the type of repair needed, and then must be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing "0"'s and "1"'s into the memory cells. It is conventional for tests to include writing patterns into the memory space such as checkerboards, walking "1"'s and butterfly patterns. A test developer can more easily and efficiently generate a program to create these patterns with the aid of algorithmic constructs. A test pattern that is algorithmically coherent is also easier to debug and use logical methods to isolate portions of the pattern that do not perform as expected. A test pattern that is generated algorithmically using instructions and commands that are repeated in programming loops consume less space in tester memory. Accordingly, it is desirable to have algorithmic test pattern generation capability in a memory tester.

Precise signal edge placement and detection is also a consideration in the effectiveness of a non-volatile tester. In order to capture parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the memory device under test.

In order to properly test larger memories the tester must be equipped with a significant amount of memory to properly store all of the test vectors that comprise a single test program. The tester must also be faster than the memory it is testing in order to properly characterize and test the timing characteristics of the IC. Historically, memory testers use SRAM for program storage. The SRAM is embedded into the tester ASIC to achieve the greatest tester efficiency. SRAM is useful because it exhibits a minimum latency permitting accurate reproduction of timing conditions for testing purposes. SRAM, however, is costly. As test programs increase in size, a natural solution is to merely increase the amount of embedded SRAM in order to accommodate the entire test program. SRAM, however, is expensive. It is difficult to cost-effectively embed a sufficient amount of SRAM into the tester ASIC to store the entire test program. An alternative to the SRAM is DRAM. Disadvantageously, there is a significant read latency associated with DRAM. This read latency does not permit execution of program instructions directly if it is desired to maintain precise timing. The DRAM is, however, advantageously used for storage of program instructions for use at a later time. There is a need, therefore, for a method and apparatus of using the cost effective DRAM for storage of executable software while optimizing tester performance through appropriate management of the SRAM and DRAM memories.

SUMMARY

A method for managing execution of a program downloads a file containing a called pattern and at least one dependency of the called pattern. The method then stores contents of the file in a secondary memory and initiates execution of the called pattern. Test dependencies of the called pattern are identified after which the process selectively copies the called pattern and the identified test dependencies into a primary memory. Finally, the pattern is executed.

A method for managing execution of a program, wherein the program initiates execution of one or more patterns and one or more of the patterns depend upon one or more software units, downloads a test file into a secondary memory. The test file contains the patterns and the software units that are downloaded into the secondary memory. The process then initiates execution of a called pattern from the available patterns and determines dependencies of the called pattern. The process allocates space in a primary memory for the called pattern and the dependencies. The called pattern and the dependencies are then selectively copied from the secondary memory to the primary memory prior to executing the called pattern.

An apparatus for calculating a new address location comprises a comparator accepting an old address and a threshold address and an output value indicating whether the old address is greater than the threshold address. An arithmetic operator accepts the old address and an address offset value and generates a sum of the old address and the address offset value. A selector accepts the old address and the sum and selects an output of the selector based upon the comparator output value. The output of the selector is the new address location.

A method for managing development of a program in a tester stores one or more test patterns in a memory, the one or more test patterns including a first section and a remaining section. The method then moves the first section to a different location in the memory and offsets calls in the first section to branching destinations in said first section. The process then inserts one or more instructions in a position adjacent to the different location in the memory, and offsets calls in the remaining section to branching destinations in the remaining section.

A method for managing development of a program in a tester stores at least two patterns in a memory, the patterns populating the memory in a first section, a second section, and a remaining section. The process then deletes the second section and moves the remaining section to be contiguous with the first section. Calls in the first section to branching destinations in said remaining section are offset and then calls in the remaining section to branching destinations in said first section are offset.

Advantageously, a method and apparatus used in a memory tester according to the teachings of the present invention permits efficient and cost effective use of DRAM in conjunction with SRAM to achieve optimal program storage and performance.

BRIEF DESCRIPTION OF THE DRAWINGS

FIGS. 4 and 5 shows data structures used in a software embodiment according to the teachings of the present invention.

DETAILED DESCRIPTION

Figure 1:
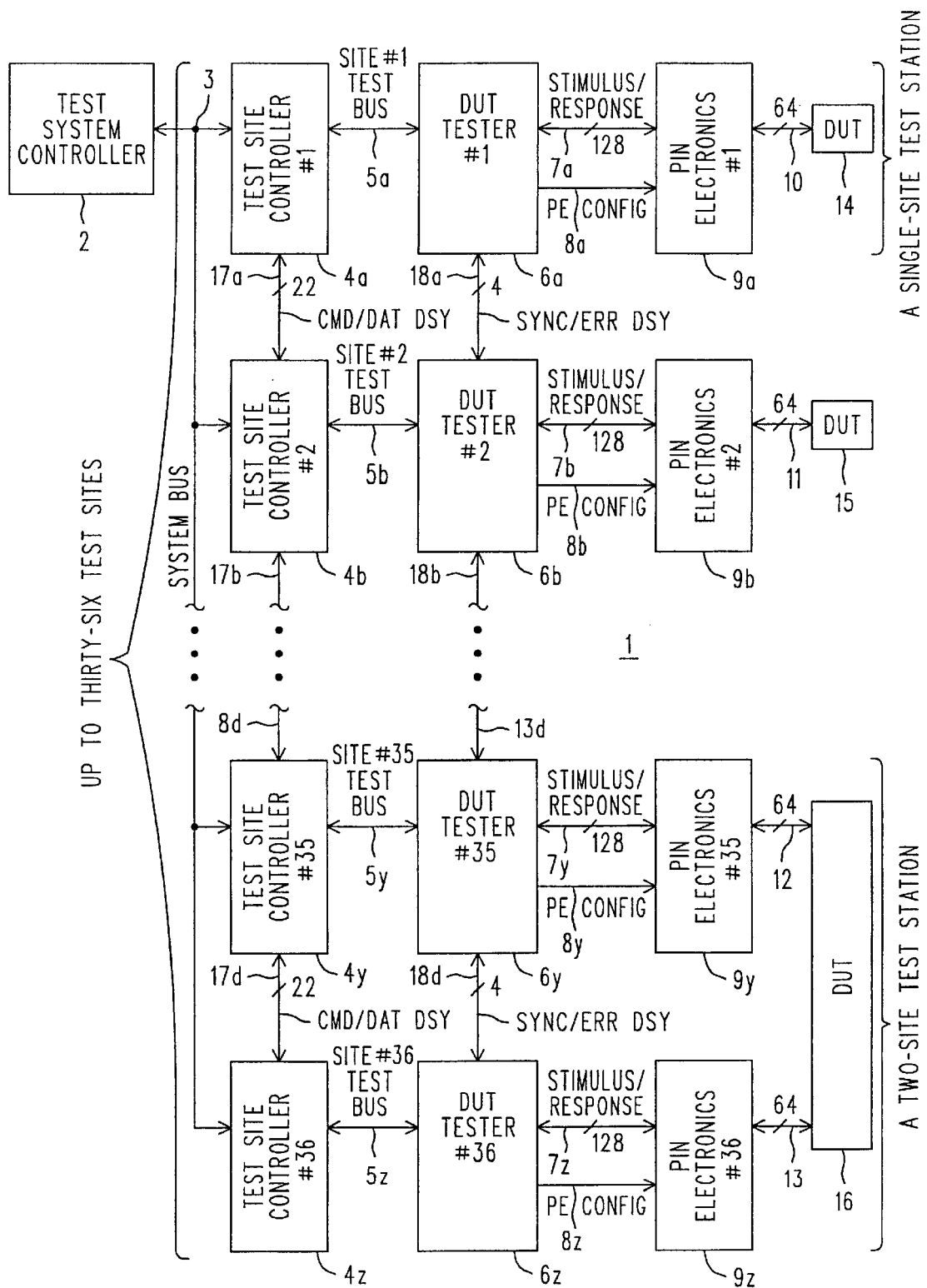
FIG. 1 is a high-level block representation of a memory tester according to the teachings of the present invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

To briefly consider the opposite case, one should not assume that an entire Test Site is needed to test a single DUT, or that a single Test Site can test but a single DUT. Suppose that a wafer had two (probably, but not necessarily, adjacent) dies, the sum of whose test channel requirements were sixty-four channels or less. Both DUT's can be tested by a single Test Site. What makes this possible is the general purpose programmability of each Test Site. A test program executed by the Test Site may be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. The only difference is individually keeping track of whether the two "component DUT's" pass or fail, as opposed to a unified answer for the "third" DUT (that is, there is an issue concerning what portion of the "third" DUT failed). This "Single-Site Multi-Test Station" capability is largely conventional, and we mention it here for the sake of completeness, and to ward off potential confusion and misunderstanding when comparing it to the notion of bonding two or more Test Sites together.

Were it not for this notion of reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were split to create more Test Stations (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a PC running NT) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four MB of combined program and data memory running a proprietary operating system called VOS (VersaTest O/S), which was also used in earlier products for testing non-volatile memories (e.g., the Agilent V1300 or V3300).

For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_WHIZ_13. If that program is already available within Test Site Controller #1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named bust as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory Cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes on the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9a. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8a.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage has, besides power supplies and water cooling (fans can be a source of contamination in a clean room environment), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to create master/slave relationships between various the Test Site Controllers. We shall denote these daisy chained style communication arrangements with the suffix noun "DSY", instead of "BUS". Thus, we might refer to a Command/Data DSY instead of a Command/Data Bus. Now, the notion that information "enters B and is selectively passed on" may suggest that traffic is replicated onto a separate set of conductors before being passed on. It could be that way, but for performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4a–4z that can populate the four card cages, each with nine Test Site Controllers. Let's denote them as 4a–4f, 4g–4m, 4n–4t and 4u–4z. (Never minding, as explained earlier, that these are nominally only twenty-six subscripts—the reader is invited to imagine that there are another ten subscript symbols in there, someplace.) A CMD/DAT DSY 17a (Command & Data Daisy Chain) interconnects the Test Site Controller 4a–4f that are in one card cage, while a different CMD/DAT DSY 17b interconnects the Test Site Controllers 4g–4m in another card cage. The same arrangement exists for the remaining card cages, and Test Site Controllers 4n–4t and 4u–4z, respectively. We have earlier said that the DSY do not leave the card cages, in that "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17a–d that we have been discussing exist between the various Test Site Controllers 4a–4z. There is a similar arrangement for the SYNC/ERR DSY 18a–18d and the DUT Testers 6a–6z. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

Figure 2:
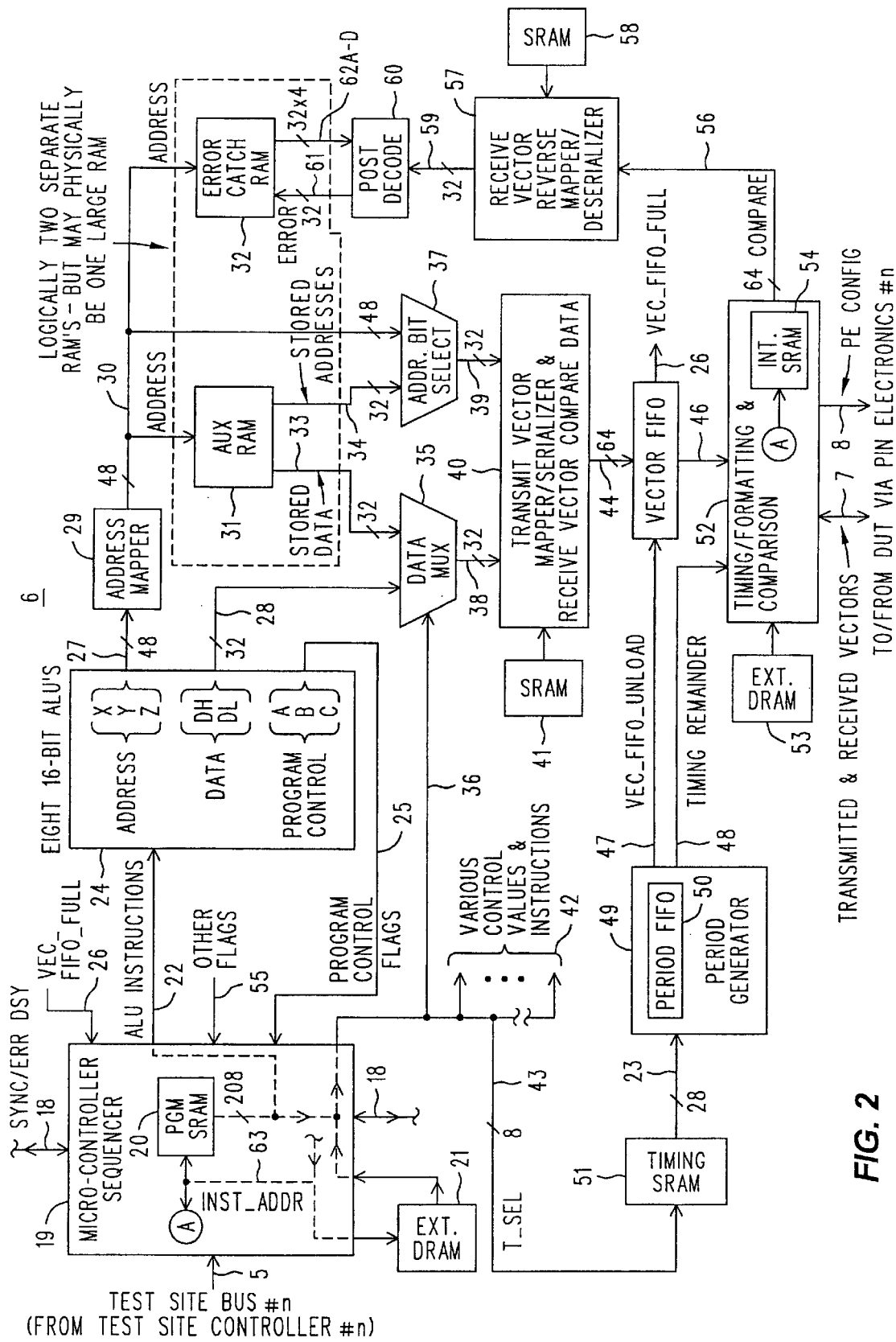
FIG. 2 is a next level block representation of a DUT tester portion of a memory tester according to the teachings of the present invention.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is a fairly well populated with stuff; especially so for a "simplified" block diagram. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Micro-Controller Sequencer 19, which may be likened to a special purpose microprocessor. It fetches instructions from a program memory, which may be either internal to the Micro-Controller Sequencer 6 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is a large IC), so its size is limited. The external DRAM can be provided in adjustable amounts of considerable quantity, but is fast only when accessed in sequential chunks involving linear execution and no branching. Programming in the SRAM 20 most often that which is intensely algorithmic, while the EXT. DRAM 21 is best suited for material not readily generated by algorithmic processes, such as initialization routines and random or irregular data.

The instruction word executed by the Micro-Controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of ALU INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address in ways familiar to those who understand about microprocessors. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO_FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen) to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for bottom) mirror image of another section of circuitry. This has the effect of rearranging what the bits mean, as far as what sequential address values are in physical order within that circuitry. This chip layout property may occur many times, and it may well be the case that how one group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how its actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to an Aux RAM 31 and to an Error Catch RAM 32, which, while having separate functions, may nevertheless be implemented selectable partitions in one larger overall RAM. The mapped address output 30 is also applied as one input to an Addr. Bit Select circuit 37, which is described below.

Consider the Aux RAM 31. Its function is to retain data patterns 33 and addresses 34 that can be applied to the DUT. These are logically separate outputs from the Aux RAM 31, since they are treated somewhat differently and used in different places. (The AUX RAM 31 is not a dual "port memory", but is preferably of several banks whose outputs are applied to MUX's.) In keeping with this, it may be that Stored Data 33 is kept in one bank or range of addresses of the Aux RAM 31, while Stored Addresses 34 are kept in another. Also, we have not shown an explicit mechanism for writing to the Aux RAM 31. That is accomplished by an addressed bus operation initiated by a Test Site Controller 4 at the behest of the program it is executing. (There is an "under the floorboards," as it were, "utility services" bus called the "Ring Bus" [not shown—as it would clutter the drawing immensely] that goes to just about everything in FIG. 2.)

The Error Catch RAM 32 is addressed by the same address that is applied to the Aux RAM 31, and it either stores or retrieves information about errors, which operations are performed in conjunction with a Post Decode Circuit, to be discussed later. As with the paths 33 and 34 from the Aux RAM 31, paths 61 (into the Error Catch RAM) and 62 (from the Error Catch RAM) are preferably MUX'ed outputs from a multi-bank memory (the Error Catch RAM 32), in accordance with configuration information distributed by the Ring Bus (not shown).

Note that the Data MUX 35 has as inputs the STORED DATA output 33 from the Aux RAM 31 as well as data 28 from the registers DH and DL in the collection 24 of ALU's. The Data MUX 35 selects which of these inputs (28, 32) to present as its output 38, which is then applied as one of two vector components to a Transmit Vector Mapper/Serializer/Receive Vector Compare Data Circuit 40 (the other component is the output 39 of the Addr. Bit Select circuit 37). Data MUX 35 performs this selection in accordance with values 36 stored in PGM SRAM 20. Circuit 40 can perform three functions: assemble vector components (38, 39) into an ordered logical representation an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19. The output of Circuit 40 is an up to sixty-four bit vector 44 that is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT via the associated instance of Pin Electronics 9. That is, each instance of Pin Electronics 9 receives Transmitted & Received Vectors 7 and Pin Electronics configuration information 8 from its associated Timing/Formatting & Comparison circuit 52.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54.) The Internal SRAM 54 (or external DRAM 53) assists in the production of Drive and Comparison cycles. Drive cycles apply a transmit vector to the DUT. Comparison cycles receive a vector presented by the DUT and examine it to determine if it matches previously supplied comparison data. Both Drive and Comparison cycles are adjustable as to their duration, whether and when a load is applied, and when data is latched or strobed. The comparison produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60. At present, it is sufficient to say that the Post Decode circuit 60 can inspect via programmatic criteria both incoming error information 59 and (previously) stored error information 60 (stored in Error Catch RAM) to produce condensed and more readily interpretable error information which may then by stored back into the Error Catch RAM 32 via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished.

With specific reference to FIG. 2 of the drawings, there is shown a DUT tester 6, which is an application specific integrated circuit (ASIC) comprising a primary memory 20 connected to a sequencer 19. The primary memory 20 comprises a 4 k vector SRAM having a 208-bit vector length. Each vector represents a single instruction to the sequencer 19 and surrounding circuitry. Accordingly, the terms test vector and instruction are used interchangeably herein. The primary memory 20 stores a plurality of program vectors, or instructions, that are executed by the sequencer 19 to perform a test pattern. The program vectors as executed by the sequencer 19 generate electrical control signals that are fed into a timing control and analog pin circuitry 52 to exercise the device under test (DUT) 14. A secondary memory 21 is not on board the ASIC and is a 256 Mbit DRAM. As one of ordinary skill in the art appreciates, the DRAM memory 21 is less costly than the SRAM per bit of memory capacity, but has a read latency associated with it. It is often not possible to accommodate all of the necessary test patterns and subroutines to test an entire DUT 14 into the 4 k SRAM. A feature of a method according to the teachings of the present invention utilizes DRAM for storage of one or more test patterns while making provision to load those software elements that are required for execution of each test pattern. The administration is performed without user intervention in order to maximize design freedom for the test developer and ease of use for the test user.

Figure 3:
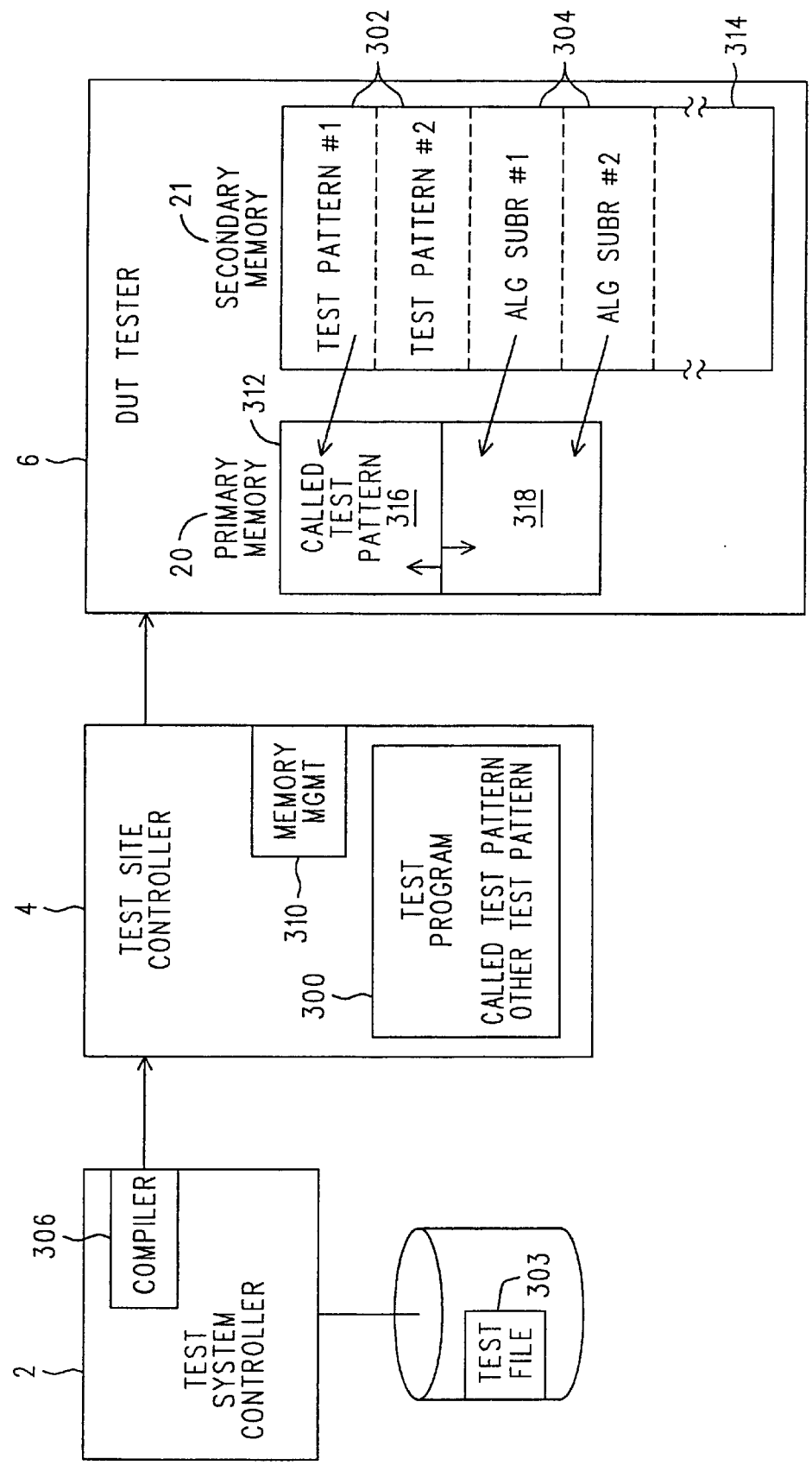
FIG. 3 is a simplified block diagram of interconnections to a single test site and representation of software units used in the system.

With specific reference to FIG. 3 of the drawings and for the purpose of establishing consistent nomenclature, there is shown some of the component parts of a single test site together with an abstraction of the software units and their locations with respect to the test system controller 2, the test site controller 4, and the DUT tester 6. A test program 300 in a specific embodiment is a collection of "C" instructions that run on the test site controller 4. Typically, the test program 300 fully tests one type of DUT. The test program 300 calls one or more test patterns 302 that are located in the primary memory 20. The test pattern 302 typically comprises a series of program instructions or test vectors. Also downloaded into the primary and secondary memories 20, 21 are one or more subroutines 304 that are called by certain ones of the test vectors. Multiple test vectors generate sequences and groupings of "1"'s and "0"'s that are written to and read from the DUT 14 that verify proper operation of a function for the DUT 14. There are two different types of subroutines 304 according to an aspect of the present invention, algorithmic and logic. Logic subroutines are characterized by a simplified instruction set including direct specification of vectors comprising "1's" and "0's" that are applied to the DUT 14, repeating an instruction a specified number of times, and returns from the logic subroutines. Algorithmic subroutines are characterized by a superset of the instructions available in a logic subroutine, and additionally include instructions that call other subroutines, generate patterns through the use of arithmetic operations, unconditional and conditional branching, and calls that transfer sequencer instruction fetch operations to a different memory source. Due to the additional flexibility of the algorithmic subroutines, the algorithmic subroutines have the capability of generating very large test patterns using a small amount of memory. This fact permits efficient use of the embedded SRAM 20. Conversely, the logic subroutines tend to require more storage space.

A compiler 306 accepts source code that is prepared by a test developer that contains instructions that make up one or more test patterns as well as any algorithmic and logic subroutines the test patterns may call. The compiler is run "offline", i.e. at a time different from test time, either on an external computer or on the test system controller 2. The compiler converts the source code into object code that is executable by the sequencer 19 and stores all of the compiled test patterns, algorithmic and logic subroutines in a test file 308 on a disk accessible by the test system controller 2. Each test pattern in the source code is compiled as if it were to be stored in memory beginning at address zero. As one of ordinary skill in the art appreciates, if more than one test pattern is compiled, then only one test pattern can be stored in memory beginning at address zero. Accordingly, reconciliation of the proper addresses is performed at a time after compilation of the source code into object code.

Multiple test files 308 may reside on the test system controller 2, each test file 308 comprising a different test for different devices or device functions. It is typical that each test file 308 contains many test patterns 302. Each test file 308 may also contain one or more algorithmic subroutines 304 and/or one or more logic subroutines 304 that may be called by one or more of the test patterns 302. It is also possible that a test pattern 302 in one test file 308 may reference a subroutine 304, either algorithmic or logic, that is located in a different test file. In that case, proper performance of the test pattern 302 requires both test files 308 be loaded into the DUT tester 6.

Two distinct functions in the memory management process 310 run on the test site controller 4 include a test file loading process and a test pattern linking process. The test file loading process comprises accepting a test file 308 from the test system controller 2 and downloading it into the secondary memory 21 in the DUT tester 6. During the loading process, the test site controller 4 retains information concerning the placement and organizational structure of certain ones of the software units in the secondary memory 21. The test patterns and algorithmic subroutines, however, are executed out of the primary memory 20. Additionally, because the vectors in the test pattern must maintain precision timing relationships, all necessary software units must be present and available to the sequencer 19 before the test pattern is initiated. After the test file loading process, the test file linking process determines which test patterns and algorithmic subroutines in the secondary memory 21 must be loaded into the primary memory 20, copies the appropriate test patterns and algorithmic subroutines to the primary memory 20 from the secondary memory 21, and then resolves references to the different software units.

Figure 11:
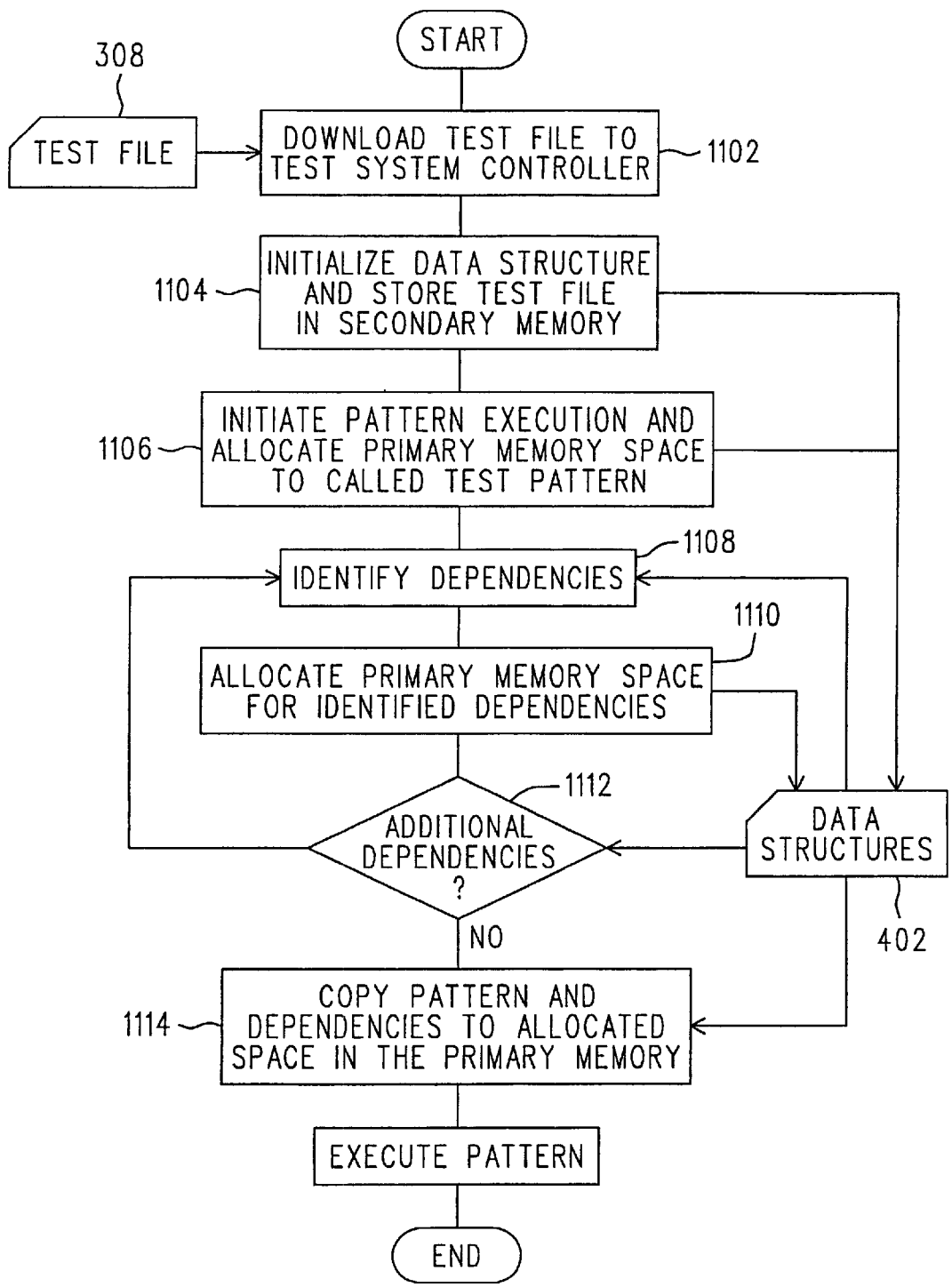
FIG. 11 is a flow chart of a method according to the teachings of the present invention.

As the test file 308 is downloaded into the DUT tester 6, the test file loading process performed by the test site controller 4 initializes and builds four data structures. See reference numerals 1102 and 1104 in FIG. 11 of the drawings. With specific reference to FIGS. 4 and 5 of the drawings, there is shown a data structures including a File Descriptor 402, a Pattern Descriptor 404, a Subroutine Descriptor 406, and a Logic Descriptor 408. The content of each of the data structures is also shown in FIGS. 4 and 5. Header information that is part of the test file 308 is used to assign appropriate values to portions of the data structures. Accordingly, after the test file 308 is downloaded into the DUT tester 6, all test patterns and subroutines in the test file 308 are stored in the secondary memory 21 and the data structures 402, 404, 406, 408 for each pattern 302 and subroutines 304 contain values from the test file header.

The test patterns 302 and the algorithmic subroutines must be stored in the primary memory 20 before the sequencer 19 is able to execute them. Accordingly, the test file linking function of the memory managment process identifies the test patterns 302 and the algorithmic subroutines 304 that are necessary to run the called test pattern 312 and copies them into the primary memory 20 prior to test pattern execution. The logic subroutines 314 are typically stored in the secondary memory 21 and are called by a series of program instructions in the primary memory 20. In some cases, which are described later in this document, all or part of a logic subroutine 314 may also be run from the primary memory 20. test file linking process first identifies the called test pattern 312. The process then locates the data structure relevant to the called test pattern 312 in the Pattern Descriptor data structure 404 and executes a memory management Link Pattern routine for the called test pattern 312. The function of the Link Pattern routine is to organize the storage and resolve the links between the software units that are to reside in the primary memory 20. For purposes of discussion, in its most general sense, the Link Pattern is executed for a "called element", "the callee", sending the routine two parameters indicating a called element name and a called element type. The called element name is a string of characters used to identify the called element. The called element type is either a zero (0) indicating a test pattern type, a one (1) indicating an algorithmic subroutine type, or a two (2) indicating a logic subroutine type. The Link Pattern routine is used for three different called elements including a test pattern 302, an algorithmic subroutine 304, and logic subroutine 314. The Link Pattern routine is executed by the memory management process for a first time for the called test pattern, but is executed by the memory management process for subroutines as well. Hence, the parameter reference to a "called element". The Link Pattern routine returns a value that indicates the beginning address of where the called element either already exists or is destined for storage in the primary memory 20.

The Link Pattern routine checks a loadOffsetInt variable 504 in the Pattern Descriptor 404 for the called element. The loadOffsetInt 504 indicates the address of the first instruction in the called element in the primary memory 20. If there is a valid primary address value in the load OffsetInt 504, the called element already exists in the primary memory 20 and the Link Pattern routine completes and returns the address value. If there is no primary valid address value in the loadOffsetInt 504, and the called element type is either the test pattern or algorithmic subroutine type, then space for the called element is allocated in the primary memory 20 using a pattern range variable or a subroutine range variable and a vector count 506 for the called element. See reference numeral 1106 in FIG. 11 of the drawings. A first portion 316 of the primary memory 20 is allocated for test patterns and a second portion 318 of the primary memory 20 is allocated for algorithmic subroutines. For ease of storage and allocation tracking, the test patterns 302 are stored in the primary memory 20 beginning at address zero and the algorithmic subroutines 304 are stored in the primary memory 20 filling up the last addresses first although maintaining the sequential incrementing pattern of instructions within the subroutine itself. The pattern range variable keeps track of the allocated memory in the first portion 316 and the subroutine range variable keeps track of the allocated space in the second portion 318. The pattern range and subroutine range variables 316,318 are checked to assure that a total allocated space does not exceed the 4 k that is available.

After allocating space in the primary memory 20, the Link Pattern routine then performs the task of resolving references made to one or more software units not already contained in the called element, but are required in the primary memory 20 for proper operation of the called element. The references that must be resolved include first level test dependencies, for example calls in the called test pattern 316 to algorithmic and logic subroutines 304,314 that are located in a different test pattern or subroutine. Additionally, the subroutines that make up the first level test dependencies may include additional second level test dependencies and possibly third level test dependencies. There is no software limit to the number of test dependency levels that are possible. It is limited only by a subroutine call stack depth in the test site controller 4 hardware. The memory management process resolves the references, by determining which additional patterns and subroutines must be located in the primary memory 20 in order to successfully run each test pattern, see reference numeral 1108 in FIG. 11 of the drawings, and allocating space in the primary memory 20 as necessary, see reference numeral 1110 in FIG. 11 of the drawings. To perform the resolution task, the test site controller 4 performs the Link Pattern routine recursively for each of the unresolved symbols. See reference numeral 1112 in FIG. 11 of the drawings.

The process of resolving the test dependencies comprises referencing an unresolved symbol array 508 in the Pattern Descriptor 502 for the called element, "the callee". For each unresolved symbol 508 in the array, the Link Pattern routine references an unresolved symbol offset 510 in an unresolved symbol data structure 512 that identifies the instruction in the called element that references the unresolved symbol 508, "the caller". The Link Pattern routine also checks a symbol usage 514 in the unresolved symbol 508 array that indicates the type of symbol, either algorithmic or logic, that is being referenced. If the symbol references an algorithmic instruction, the Link Pattern routine is called with the unresolved symbol name and type sent as the called element parameters. The Link Pattern routine then modifies field of the instruction in the caller to which the pattern is to branch with the address of where the called element will be located in the primary memory 21 less the offset of where the caller is destined to be located in the primary memory 20. If the callee type is a logicsubroutine, the memory management process creates and allocates primary memory storage for a generated algorithmic subroutine 602. The test file loading process generates an algorithmic subroutine wrapper for each logic subroutine. Within the wrapper is the call to the logic subroutine and some number of vectors from the beginning of the logic subroutine. The algorithmic subroutine wrapper is named with a mangled string with the logic subroutine name included in the mangled string. The sequencer 19 executes the logic subroutines 314 from the secondary memory 21. The logic subroutines tend to be lengthy and may be longer than the 4 k primary address space. Accordingly, it is beneficial to have the capability to execute subroutines from the larger secondary memory 21.

Figure 6:
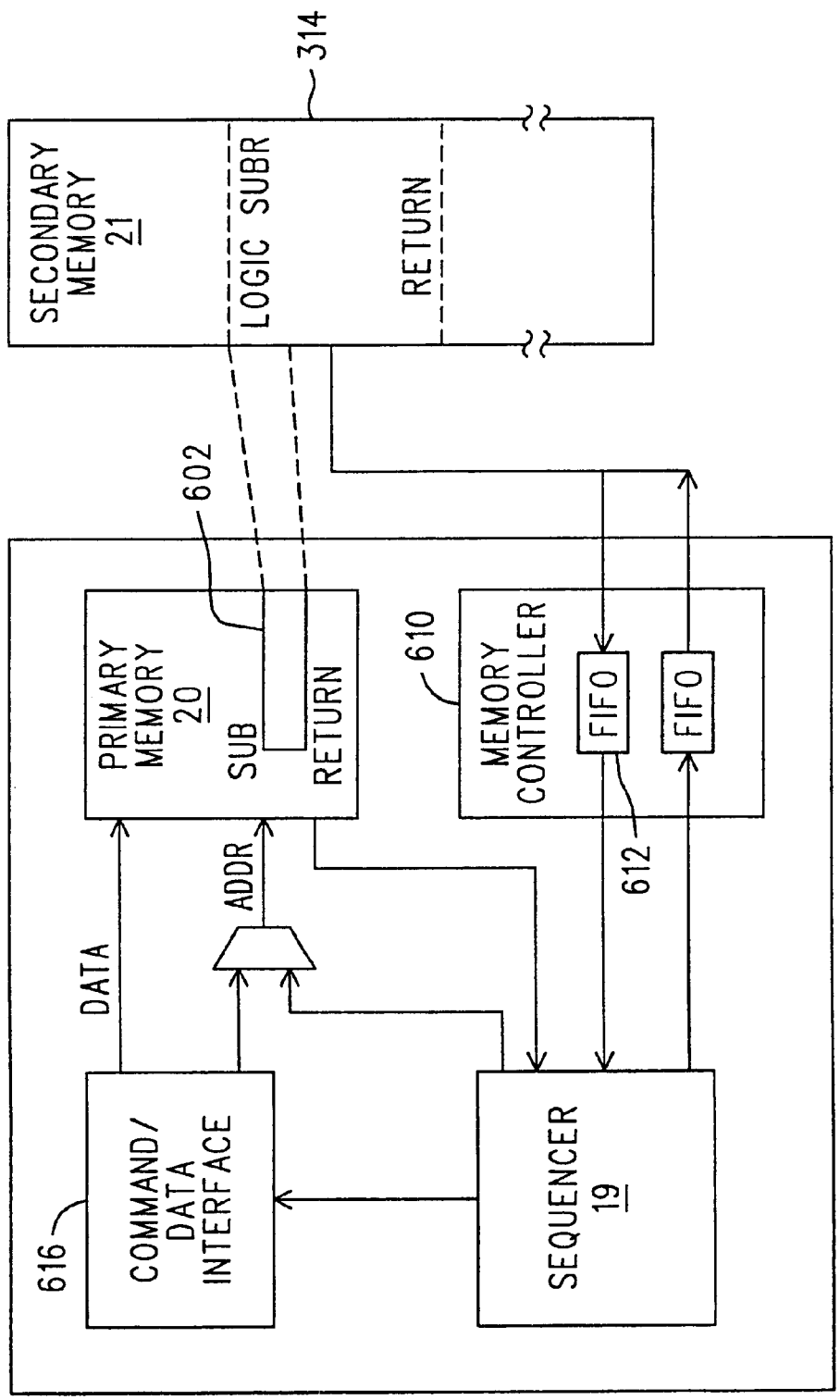
FIG. 6 is a simplified block diagram of some of the components parts of a DUT tester shown in logical relationship with a secondary memory.

The secondary memory 21, however, has a read latency associated with it that adversely affects timing of vectors at the DUT. With specific reference to FIG. 6 of the drawings, there is shown a block diagram illustrating the process by which the sequencer 19 executes a logic subroutine 314 from the secondary memory 21. In order to successfully execute logic subroutines 314 from the secondary memory 21 while avoiding the adverse affects of the secondary memory read latency, a plurality, such as 52, instructions in the logic subroutine 314 are copied into a generated algorithmic subroutine 602 just after the command that initiates access to the logic subroutine instructions. As the logic instruction is converted to an algorithmic instruction, it is padded with benign values and performs the operation as an algorithmic instruction. The initiating command begins to fill a tertiary memory 612, which is a FIFO that does not have a read latency, while the copied logic subroutine instructions are executing. If the number of copied vectors is 52, the initiating command points to the beginning of the called logic subroutine plus an offset of one more than the plurality of instructions copied, 53 in the example, to point to an instruction that is to be executed just after the copied instructions. After the plurality of copied logic subroutine instructions, the memory management process inserts a tertiary memory access instruction that causes the sequencer 19 to transfer the fetch and execute instructions from the primary memory 20 to the tertiary memory 612. During execution, as instructions are fetched from the tertiary memory 612, a memory controller 610 continues to fill the FIFO 612. The logic subroutine concludes with a return command that will transfer sequencer 19 fetch and execute operations back to the primary memory 20. The return command after the tertiary memory access command causes return of control from the generated algorithmic subroutine to the calling pattern or routine.

The recursive Link Pattern process ends when all unresolved symbols of apg instruction type are resolved by having been allocated storage space in the primary memory 20 either directly or indirectly as in the case of the logic subroutines. At the termination of the Link Pattern recursive process, values for the loadOffsetInt 504 are assigned valid primary memory ranges for the patterns and algorithmic subroutines used by the called test pattern and memory management process calls a copy memory command to copy the necessary patterns and algorithmic subroutines into the allocated space in the primary memory 20. In a sequential processing system, such as the embodiment described, the copy memory step in the process occurs after all of the necessary pattern and algorithmic subroutines are allocated space. See reference numeral 1114 in FIG. 11 of the drawings. Future embodiments, however, may be implemented in a multi-tasking environment in which case, the copy memory commands are issued at the end of each Link Pattern routine for the pattern or algorithmic routine allocated. The issued copy memory commands are queued up for processing by a different routine that may be launched in parallel with the Link Pattern routine that continues to allocate primary memory space for each test pattern.

As the necessary patterns and algorithmic subroutines are loaded into the primary memory 20, the memory management process adjusts the address references of the branching instructions comprising the jump to address and call to subroutine instructions. Because all patterns and subroutines are compiled as if they are stored beginning at address zero, the address references for the branching instructions have a zero offset. Depending upon where in the primary memory 20 the called elements are located, they must be offset by values according to the relative locations of each of the copied software elements.

Figure 7:
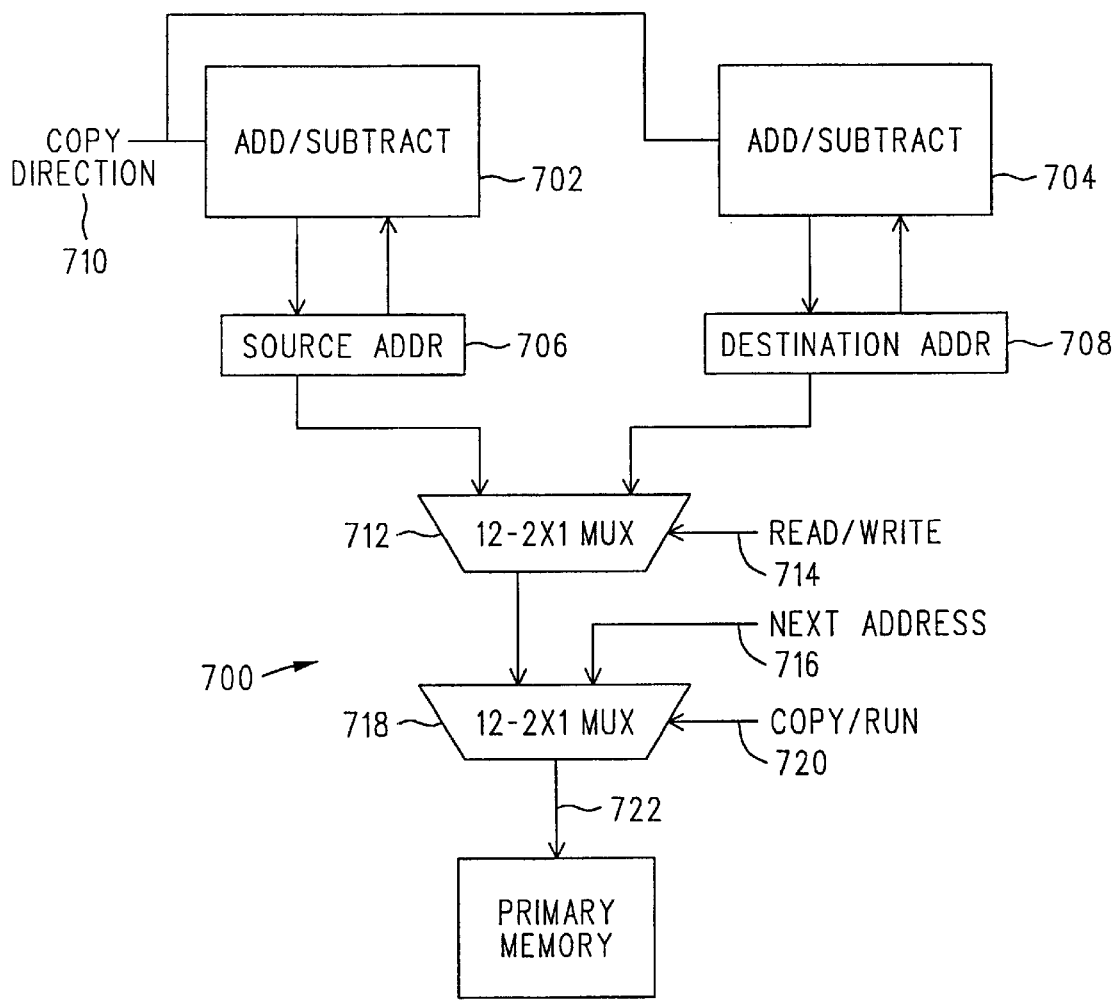
FIG. 7 is a block diagram of an embodiment of a circuit to perform copying operations according to the teachings of the present invention.

Because the memory management process occurs at run time, the process of copying and resolving references should occur in as little time as possible. Accordingly, the copy memory function is implemented in hardware for speedy operation. With specific reference to FIG. 7 of the drawings, there is shown a primary address manipulator 700, which is part of a command/data interface 616 shown in FIG. 6 of the drawings. The embodiment of the primary address manipulator 700 shown has a 12-bit construction that coincides with the 4 k address space of the primary memory 20. There is also a secondary address manipulator (not shown), which is part of the memory controller 410. The secondary address manipulator has a 25-bit construction for addressing the 32-bit wide/256 Mword deep secondary memory 21. But for a parallel bit bus width, the block diagram of the address manipulator is the same for both the primary and the secondary memories 20, 21. The discussion of the address manipulator design as well as the figure supporting the discussion is limited to the primary address manipulator 700 for purposes of clarity. One of ordinary skill in the art is able to scale the design as necessary.

The address manipulator 700 comprises a source add/subtract block 702 and a destination add/subtract block 704. The source add/subtract block 702 communicates to a source address register 706, which in turn feeds back to the source add/subtract block 702. The destination add/subtract block 704 communicates to a destination address register 708, which in turn feeds back to the destination add/subtract block 704. Both the source and destination add/subtract blocks 702,704 take a copy direction bit 710 input that indicates whether the add/subtract blocks 702,704 are to increment or decrement a current value in the address register 706,708. The source and destination address registers 706,708 feed a 12 bit wide 2×1 read/write multiplexer 712. The copy direction bit 710 is the read/write multiplexer 712 select control and indicates which address register contents to present at its output. The output of the read/write multiplexer 712 and a next address word 716 are fed into a 12-bit wide 2 to 1 selection multiplexer 718. The next address word 716 comes from the sequencer 19 and represents a next address location for an instruction fetch when the DUT tester 6 is executing a test pattern. A single copy/run bit 720 is a product of the sequencer state machine and indicates whether the DUT tester 6 is in an "execution" state or an "administration" state. The copy/run bit 720, therefore, selects, which address input, is to be presented at the output of the copy/run selection multiplexer 718. The output of the selection multiplexer 718 communicates to the primary memory 20 via an address bus 722 and is used to address the primary address space 20 during test pattern execution as well as memory management. The copy/run bit 720 is set to one value during test pattern execution when the address manipulator 700 is essentially by-passed and the sequencer 19 is determining the next address from which to retrieve an instruction. The copy/run bit 720 is set to an opposite value between test pattern execution and during memory management when the address manipulator 700 is used for memory copy operations.

As the instructions are copied from the secondary memory 21 into the primary memory 20, actual address values referenced in call and jump operations are appropriately modified. With specific reference to FIG. 9 of the drawings, there is shown a data manipulator that provides a hardware calculation for address resolution that is performed during the copy operations. The data manipulator uses two 12-bit registers; a threshold register 902 and an offset register 904. The threshold register 902 is loaded with an address location of the highest value memory address where the offset is not needed. The offset register 904 is loaded with a value against which memory addresses are to be offset once the system identifies those address requiring offset. A 12-bit old address input 906 is simultaneously fed to a 12-bit comparator 908, a 12-bit 2×1 relocate multiplexer 910, and a relocate adder 912. The comparator 908 compares the input address 906 with the threshold register 902 and outputs a single add select bit 914 indicating whether the old address is less than or equal to the value in the threshold register 902. A false bit indicates that the memory location designated by the input address 906 is not to be offset. A true value indicates the opposite. The add select bit 914 is input into a 12 bit wide 2×1 adder mux 916 and selects either the input address 906 or the sum of the input address added and the offset register 904 to generate a 12-bit relocation address 918. The input address 906 and relocation address 918 are input into the relocate mux 910. The relocate mux 910 is operated by a relocate bit 922, which serves to by-pass the data manipulation process entirely or not. The source of the relocate bit 922 is a detector (not shown) that identifies whether the instruction currently being copied into the primary memory is a call or a jump instruction. There are thirteen sixteen bit words that comprise the entire 208-bit program instruction word. The detector comprises logic gates that identify one of the thirteen sixteen-bit words that contain the bits that identify the instruction as a call or a jump instruction and then decodes the bits to generate the relocate bit if the instruction is a call or a jump instruction. If the instruction is not a call or a jump instruction, the relocate bit 922 is false and the old address value is selected. If the instruction is a call or a jump instruction, the relocate bit 922 is true and the new address value is selected. The output of the relocate mux 910 is a new address value 924. The new address value is used to replace the old address value in an address field in the call or jump instruction as it is copied from the secondary memory 21 to the primary memory 20. The output value, therefore, is used to calculate the new address location that is to replace pointers to address locations in the primary memory when resolving branching destinations in the memory management process. Because, the new address location calculation is performed in hardware, it advantageously takes a minimum amount of time for processing.

One of the objectives of the memory management process is to maximize efficient use of the primary and secondary memories 20, 21 during test program execution. Specifically, the test patterns that are to be used by a first test pattern must loaded into the primary memory 20 prior to the first test pattern execution and then, between the first and second test pattern executions, the test patterns and subroutines that are to be used by the second test pattern must be loaded into the primary memory 20. Due to the limited size of the primary memory 20, there are cases when there is insufficient room to store the additional test dependencies from the second test pattern in the primary memory 20 when it is already populated with the first test pattern and test dependencies.

In a first memory management embodiment and after the first called test pattern is executed and before each subsequent called test pattern, the memory management process determines if all of the software units necessary to execute a new called test pattern are already loaded into the primary memory 20. If so, the new called test pattern is executed without further intervention by the memory management process. If additional software units are required, the memory management process communicates to the user that one or more necessary software units are not available. The user then determines which new test file is required. The user then loads the new test file from the test system controller to the test site controller. If there is sufficient room in the secondary memory 21, the new test file is loaded into the secondary memory 21 beginning at a memory location just after the portion containing the first test file. If there is insufficient room in the secondary memory 21, then the new test file is loaded into the secondary memory 21 by overwriting the first test file. The memory management process then determines if there is sufficient room remaining in the primary memory 20 to receive copies of the necessary additional software units, i.e. the new called test pattern and algorithmic subroutines. It is possible that many of the necessary software units are already contained in the primary memory. In that case, the memory management process determines if there is sufficient room in the primary memory 20 to copy the additional software units such as the new called test pattern and any additional algorithmic subroutines. If there is sufficient room, the additional software units are allocated to unused portions of the primary memory 20 and are then copied from the secondary memory 21. If there is insufficient room, the memory management process performs the same administration process described above by overwriting the existing memory contents.

Figure 8:
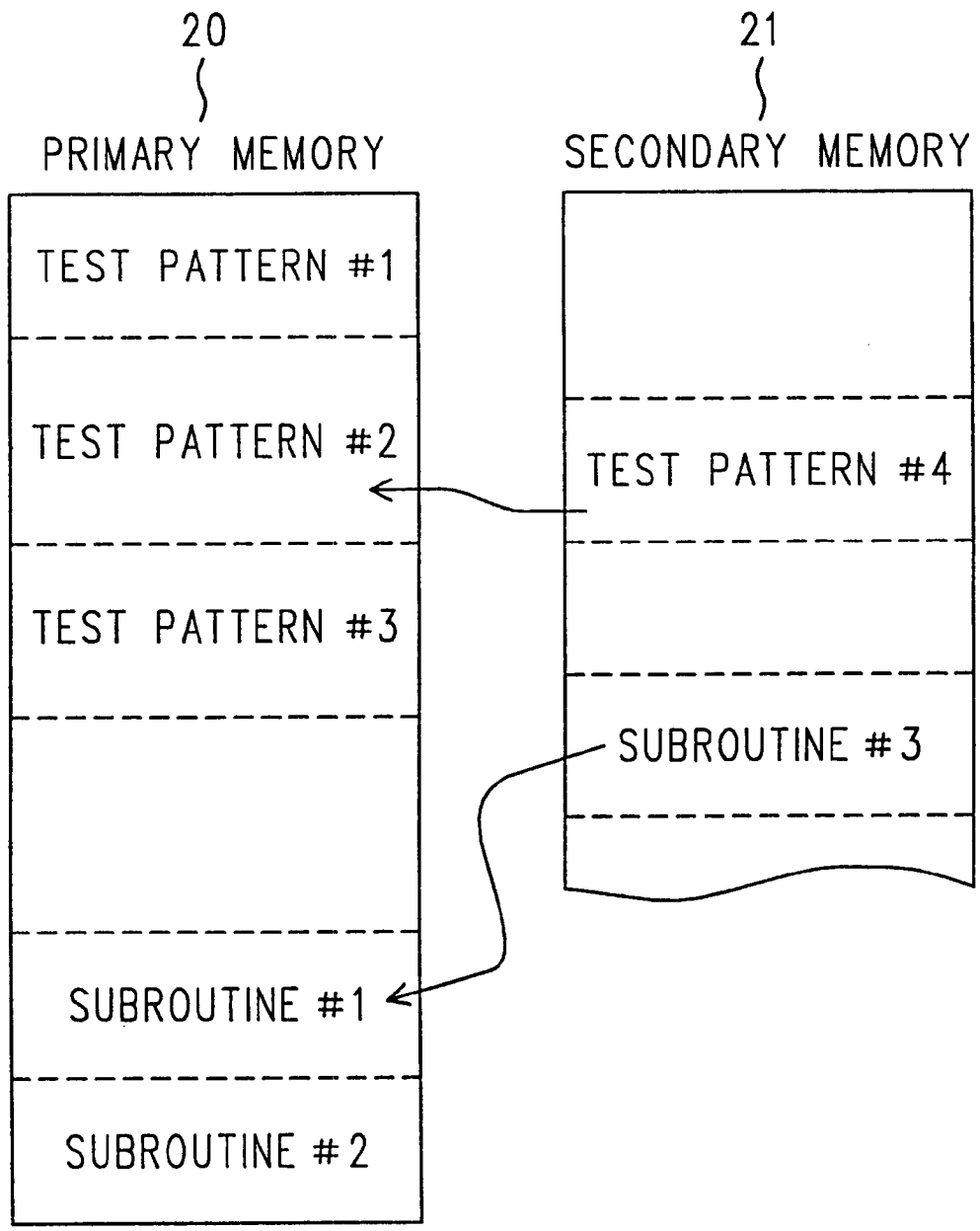
FIG. 8 is an example of a logical representation of memory organization according to the teachings of the present invention.

In a second memory management embodiment, the memory management process identifies those test patterns and algorithmic subroutines that may be overwritten with one or more new test patterns and algorithmic subroutines. The memory management process then allocates space for the new software units in areas that are either unused or no longer applicable to the new called test pattern and performs the overwrite, handles branch destination offsets, and performs a memory de-fragmentation process. With specific reference to FIG. 8 of the drawings, there is shown an illustration of the overwriting process performed by the memory management software in which the primary memory 20 is loaded with test patterns #1,2, and 3, designated by reference numerals 802, 804, and 806 respectively and algorithmic subroutines #1 and 2, designated by reference numerals 810 and 812. As an example, the memory management process may determine that test pattern #2 804 is no longer needed and should be overwritten with a smaller test pattern #4 808 located in the secondary memory 21. The memory management software identifies test pattern #2 804 as the pattern that is not needed for execution of the next test and the smaller test pattern #4 808 is needed. In the example, there is insufficient room in the primary memory 20 to merely add the smaller test pattern #4 808. Accordingly, the memory management software allocates space and then overwrites beginning at a primary memory location designated as the first memory location of test pattern #2 804. After completely copying the smaller test pattern #4 808 into the space previously held by test pattern #2 804, the memory is fragmented into a first section containing the test pattern #1 802 and the test pattern #4 808. The first section includes two contiguous test patterns, 802 and 808 in the example, and begins at the lowest address in the primary memory 200. The remaining section begins at an address location one or more positions higher than the last contiguous memory location of the first section. In order to de-fragment the memory, the memory management process copies test pattern #3 806 from its existing position in the primary memory 200 to the primary memory 200 beginning at the next address location after the smaller test pattern 808 ends. The memory management process then resolves the branching destinations that are referred to in the test pattern #3 806. To perform this resolution operation, the second embodiment includes use of a 12-bit data manipulator, implemented in hardware, to aid in the branch destination offset calculations. As one of ordinary skill in the art appreciates, the data manipulator described can be scaled up or down.

Figure 9:
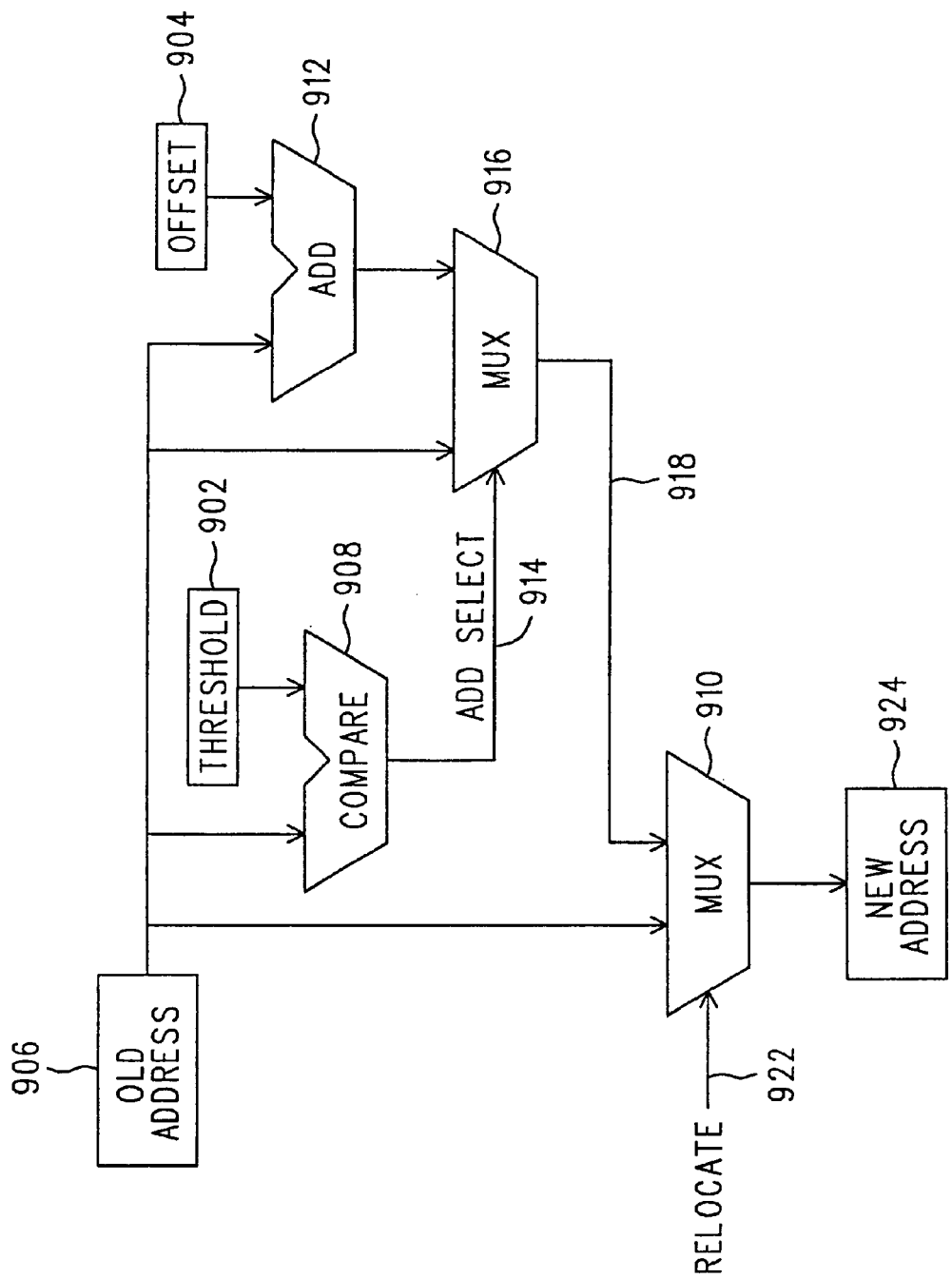
FIG. 9 is a block diagram of an embodiment of a circuit to perform de-fragmentation operations according to the teachings of the present invention.

The data manipulator shown in FIG. 9 is also used for tester development and debug operations in which one or more instructions may be inserted into either the primary or secondary memories without executing the tester compiler. This feature is used primarily when a test has been developed, compiled, and loaded into the tester and there was an error or a problem during execution of the test. A test developer would advantageously use this feature to insert or delete a small number of instructions directly into or from the primary memory 20 to aid in the isolation and correction of the error or problem.

Figure 10:
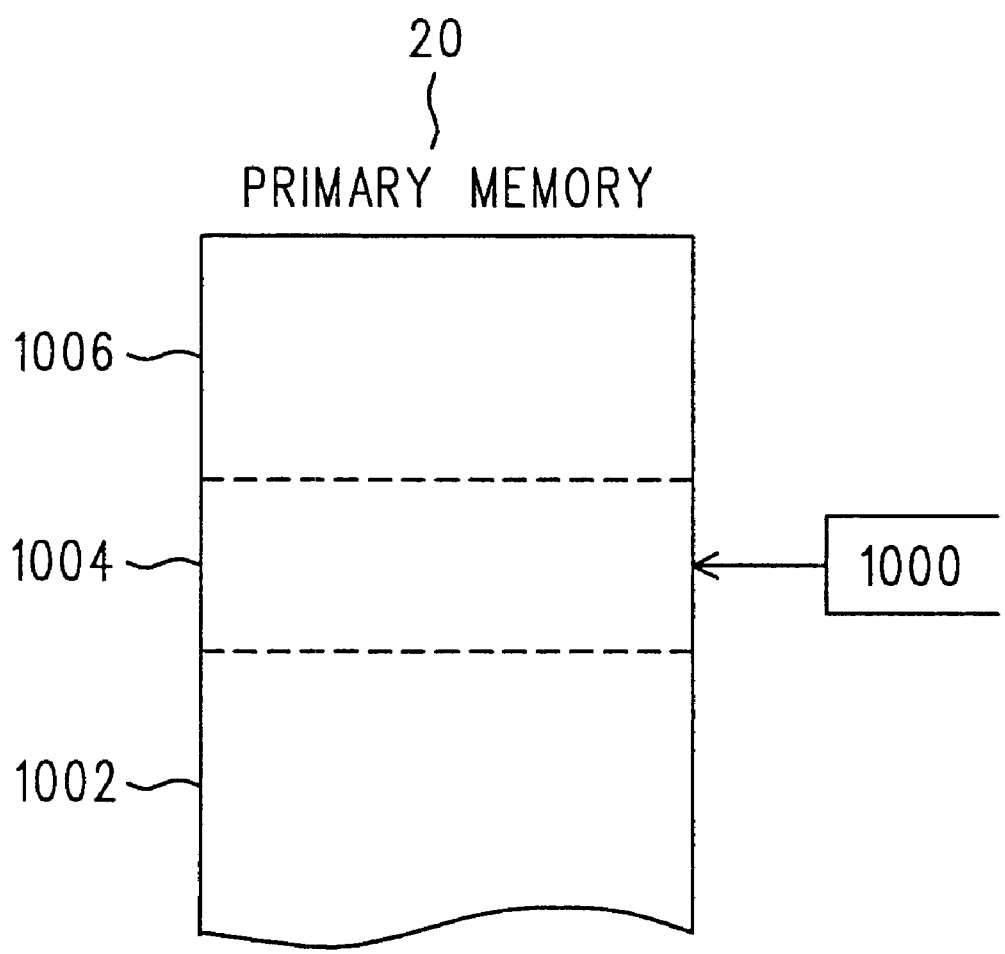
FIG. 10 is an illustration of the applicability of a development and debug application of features of the present invention.

With specific reference to FIG. 10 of the drawings, there is shown an illustration of an insertion process that is an application of the memory movement operations previously described. A deletion process is another application. Direct insertion and deletion of individual or groups of instructions to and from the primary memory 20 aids in development and debug of test patterns. The insertion process comprises moving a remaining section 1002 to higher address locations and leaving a gap 1004 between a first section 1006, and the remaining section 1002 of memory. The one or more instructions 1000 are then written to the address locations between the first and remaining sections of memory 1006, 1002. The process continues by identifying and resolving the calls in the first section 1006 to address locations in the remaining section 1002. The calls in the remaining section 1002 to locations in the remaining section are then identified and resolved. The deletion process comprises copying the remaining section to a position in the first section that overwrites those vectors that are being deleted.

Although preferred embodiments of the invention are described, they are illustrative only. Other embodiments and modifications of the invention are possible and are covered by the spirit and scope of the appended claims.

What is claimed is:

1. A method for managing execution of an integrated circuit test program comprising the steps of:

downloading a file from a tertiary memory containing a called pattern and at least one dependency of said called pattern, storing contents of said file in a secondary random access memory, initiating execution of said called pattern, identifying test dependencies of said called pattern, selectively copying said called pattern and said identified test dependencies from said secondary random access memory into a primary random access memory, executing said called pattern, and applying results of said called pattern to channels of an integrated circuit tester.

2. A method for managing execution of a program as recited in claim 1 and further comprising repeating said method for a new called pattern beginning at the step of executing.

3. A method for managing execution of a program as recited in claim 1 and further comprising repeating said method for a new called pattern beginning at the step of downloading.

4. A method for managing execution of a program as recited in claim 2 and further comprising the step of repeating said method for a new called pattern from said step of identifying additional test dependencies said step of copying further comprising overwriting said primary memory if there is insufficient space to add said new called pattern and said additional test dependencies in remaining locations in said primary memory.

5. A method for managing execution of a program as recited in claim 1 and further comprising the step of repeating said method for a new called pattern from said step of identifying and said step of copying comprises copying said new called pattern and additional test dependencies from said secondary memory to an unused portion of said primary memory.

6. A method for managing execution of a program as recited in claim 5 wherein said unused portion of said primary memory comprises portions storing called patterns and test dependencies unused in said new called pattern.

7. A method for managing execution of a program as recited in claim 1, said step of identifying further comprising the step of allocating space in said primary memory in preparation for said step of copying.

8. A method for managing execution of a program as recited in claim 7, said step of identifying further comprising the step of resolving said test dependencies in said called pattern.

9. A method for managing execution of a program as recited in claim 8, said step of resolving further comprising modifying references in said secondary memory.

10. A method for managing execution of a program as recited in claim 1, said step of copying further comprising modifying references to memory locations in said primary memory according to placement of software units to which the references refer in said primary memory.

11. A method for managing execution of a program, said program initiating execution of one or more patterns, one or more of said patterns depending upon one of more software units, the method comprising the steps of:

downloading a test file from a tertiary memory into a secondary memory, said test file comprising said one or more patterns and said at least one software unit in said secondary memory, initiating execution of a called pattern, determining dependencies of said called pattern, allocating space in a primary memory for said called pattern and said dependencies, copying said called pattern and said dependencies from said secondary memory to said primary memory, and executing said called pattern.

12. A method for managing execution of a program as recited in claim 11 and further comprising the step of repeating from said step of initiating execution for a new called pattern for all remaining patterns that comprise said program.

13. A method for managing execution of a program as recited in claim 11 and further comprising the step of repeating from said step of downloading for a new called pattern for all remaining patterns that comprise said program.

14. A method for managing execution of a program as recited in claim 11, said step of allocating further comprising modifying references in said secondary memory to said dependencies.

15. A method for managing execution of a program as recited in claim 11, said step of copying further comprising modifying references to said dependencies to address locations in said primary memory according to a placement in said primary memory of said dependencies.

16. A method for managing execution of a program as recited in claim 15, said step of modifying references further comprising determining whether said reference is to be modified and calculating a new value for said reference based upon an offset value.

17. A method for managing execution of a program as recited in claim 16, said steps of determining and calculating being implemented in hardware.

18. An apparatus for calculating a new address location comprising:

a threshold register holding a threshold value, an offset register holding an offset value, an old address input port holding an old address value, a comparator receiving said old address value and said threshold value, said comparator having a comparator output value indicating whether said old address value is greater than said threshold value, an arithmetic operator accepting said old address value and said offset value, said arithmetic operator generating a sum of said old address value and said offset value, a selector accepting said old address value and said sum, said selector having a selection control based upon said comparator output value, an output of said selector being a new address value.

19. An apparatus for calculating a new address location as recited in claim 18 and further comprising an address selector receiving said old address value and said new address value and detector identifying whether a source of said old address value requires processing, said address selector having an address selection control based upon an output of said detector.

20. A method for managing development of a program in a tester comprising the steps of:

storing one or more test patterns in a memory, said one or more test patterns including a first section and a remaining section, moving said first section to a different location in said memory, offsetting calls in said first section to branching destinations in said first section, inserting one or more instructions in a position adjacent to said different location in said memory, and offsetting calls in said remaining section to branching destinations in said remaining section.

21. A method for managing development of a program in a tester comprising the steps of:

storing at least two patterns in a memory, said at least two patterns populating said memory in a first section, a second section, and a remaining section, deleting said second section, moving said remaining section to be contiguous with said first section, detecting instructions in said first section containing branching destinations, offsetting calls in said instructions in said first section to branching destinations in said remaining section, and detecting instructions in said remaining section containing branching destinations, offsetting calls in said instructions in said remaining section to branching destinations in said first section.

22. A method for managing development of a program in a tester as recited in claim 21 and further comprising implementing said steps of offsetting in hardware.

* * * * *